United States Patent [19]

Merrill

[11] Patent Number: 5,319,259
[45] Date of Patent: Jun. 7, 1994

[54] LOW VOLTAGE INPUT AND OUTPUT CIRCUITS WITH OVERVOLTAGE PROTECTION

[75] Inventor: Richard B. Merrill, Daly City, Calif.

[73] Assignee: National Semiconductor Corp., Santa Clara, Calif.

[21] Appl. No.: 994,783

[22] Filed: Dec. 22, 1992

[51] Int. Cl.⁵ .......................................... H03K 17/10
[52] U.S. Cl. .................................. 307/443; 307/475; 361/91
[58] Field of Search ............... 307/443, 473, 475, 546, 307/548, 318, 296.5; 361/88, 91

[56] References Cited

U.S. PATENT DOCUMENTS

| | | | |
|---|---|---|---|
| 4,057,844 | 11/1977 | Smedley | 307/296.5 X |
| 4,307,306 | 12/1981 | Kucharewski | 307/296.5 |
| 4,668,875 | 5/1987 | Miyazaki et al. | 307/318 X |
| 4,860,148 | 8/1989 | Iwamura et al. | 361/91 X |
| 4,990,802 | 2/1991 | Smooha | 307/443 X |
| 5,032,742 | 7/1991 | Zanders | 307/296.5 |
| 5,160,855 | 11/1992 | Dobberpuhl | 307/475 X |
| 5,208,492 | 5/1993 | Masumoto et al. | 307/443 X |

OTHER PUBLICATIONS

"Mixing It Up with 3.3 Volts", Ristow et al. Texas Instruments, Advanced Bus Interface Applications Paper Jun. 15, 1992.
"SN74LVT16244 16-Bit Buffers/Drivers with 3-State Outputs", Texas Instruments Paper, Apr. 1992.
*Technical Horizons*, "Advanced BiCMOS Logic Technology", Perna, Texas Instruments paper, May 1992, pp. 11-16.
National Semiconductor, Design Considerations, pp. 1-26 to 1-29 "Interfacing 5.0V TTL or Reduced Swing CMOS to 3.3V LVQ" No date.
*Electronic Design*, "A Tiday Wave of 3-V ICs Opens Up Many Options: Logic Chips That Operate at 3V or Less . . . ", Bursky, pp. 37-47: Aug. 1992.

*Primary Examiner*—David R. Hudspeth
*Attorney, Agent, or Firm*—Steven F. Caserza

[57] ABSTRACT

An input stage suitable for use with any desired supply voltage VCC, including supply voltages less than 5 volts, and which is capable of withstanding an overvoltage input signal greater than VCC applied to its input pad. A pass transistor is used between the input pad and the input buffer in order to limit the voltage supplied to the input buffer, thereby allowing voltages in excess of VCC to serve as a legitimate logical one input signal to the input buffer. Overvoltage protection is used to limit the voltage on the input pad to a voltage in excess of the greater-than-VCC legitimate input voltage. An output stage is suitable for use with a wide variety of supply voltages, including supply voltages less than 5 volts, while allowing proper operation in the event that a legitimate overvoltage is applied to its output pad. ESD protection is provided in order to limit the voltage on the output pad to a voltage greater than the maximum legitimate overvoltage. Cascode devices are used to limit the voltages seen by the pull up and pull down transistors when a legitimate overvoltage is applied to the output pad. Suitable transistor switches are used to prevent excessive current from being dissipated when a legitimate overvoltage is externally applied to the output pad when the output stage is in either the high impedance mode or the active high mode.

49 Claims, 5 Drawing Sheets

LOW VOLTAGE INPUT AND OUTPUT CIRCUITS WITH OVERVOLTAGE PROTECTION

FIELD OF THE INVENTION

This invention pertains to electronic circuits, and more specifically integrated circuits utilizing input and output stages for interfacing with other integrated circuits or electronic devices.

BACKGROUND

Integrated circuits have achieved widespread use in that they are capable of reducing the space required to achieve a given electrical function, with an attendant increase in performance including a reduction in power requirements. In order for integrated circuits to conveniently interface with other integrated circuits and other types of electronic circuitry, certain industry-wide input/output (I/O) specifications have been developed. One example is the transistor-transistor logic (TTL) standard in which a supply voltage of five volts (nominal) is applied to a device. An input signal associated with a logical zero has a maximum voltage of approximately 0.7 volts and a logical one input level has a minimum voltage of approximately two volts. This TTL specification also requires that an integrated circuit provide an output voltage of at least approximately 2.4 volts associated with a logical one output signal, and an output voltage of not more than approximately 0.4 volts associated with a logical zero output level.

Current advancements in integrated circuit technology are spurring an evolution to lower voltage devices than the TTL standard. For example, one current trend is to develop integrated circuits utilizing 3 or 3.3 volt power supplies. In the future, even lower voltage devices (such as 2.4 volt devices) will be developed. Among the reasons for moving to lower voltage integrated circuits are a need to reduce system power without a corresponding tradeoff in performance.

Given the large number of TTL device types, it would be desirable to provide lower voltage devices which are capable of withstanding excessive voltages applied to their input and output pins from external sources, for example, if they are inadvertently or intentionally used with TTL devices or interfaces. Thus, for example, for a 3.0 volt device in which a high output voltage of approximately three volts corresponds to a logical one output signal, it would be very beneficial if the device were able to withstand a TTL logical one voltage level of approximately 5 volts applied to the output terminal, without consuming excessive power or incurring damage. Similarly, it would be very beneficial if a 2.4 volt device were able to withstand a logical one level of approximately 5 volts (TTL standard) or approximately 3.0 volts (for a 3.0 volt device) logical one signals apply to the output terminal.

FIGS. 1-8 are prior art input and output circuits which are known in the art. The following discussion describes the merits or lack thereof in using each of these input/output circuits in conjunction with an integrated circuit operating at a supply voltage VCC level of, for example, 3.3 volts.

FIG. 1 is a schematic diagram depicting a typical CMOS input stage. Input pad 10 receives an input signal from external circuitry for application to input buffer 13, whose output is connected to other circuitry (not shown) within the integrated circuit. Input protection diodes 11 and 12 are used in order to provide overvoltage protection for input pad 10. Input protection diode 11 forward biases when the input voltage is greater than VCC+VD, where VD is the forward bias voltage drop of input protection diode 11. Thus, when VCC is 5 volts, as in the prior art, input pad 10 is protected from voltage excursions exceeding approximately 5.6 volts. However, when VCC is 3.3 volts, and a 5 volt TTL level is applied to input pad 10, input protection diode 11 turns on, thereby providing input overvoltage protection while drawing an intolerable amount of current in a situation in which an acceptable 5 volt level is applied to input pad 10.

FIG. 2 is a schematic diagram of a typical CMOS output stage including output pad 20, output pad overvoltage protection diodes 21 and 22, pull up transistor 23, and pull down transistor 24. With a 3.3 volt power supply voltage, and an acceptable 5 volt TTL level applied externally to output pad 20, output protection diode 21 forward biases, undesirably pulling down pad 20 to 3.3 volts and consuming excessive current in the process. Furthermore, in the circuit of FIG. 2, with a 5 volt level applied to output pad 20 and the gate of P channel pull up transistor 23 being not more than three volts, P channel pull up transistor 23 turns on, causing excessive current to flow from output pad 20 through pull up transistor 23.

FIG. 3 is a schematic diagram of another prior art output stage including output pad 30, P channel pull up transistor 33, N channel pull down transistor 35, and Schottky diode 35. However, if this prior art 5 volt output stage were used with lower voltage circuits, for example with a 3.3 volt circuit in which the power supply may drop as low as 2.7 volts, the output high level applied by this circuit to output pad 30 would not be sufficiently high due to the voltage drop across Schottky diode 35. Schottky diodes used in I/O circuits tend to be very susceptible to damage due to electrostatic discharge (ESD). Furthermore, CMOS fabrication processes often do not allow for the fabrication of Schottky diodes, and this circuit must therefore be limited to use in BiCMOS devices, which are inherently more complex and expensive than CMOS processes.

FIG. 4 is a schematic diagram of another prior art BiCMOS output stage including output pad 40, P channel pull up transistor 43, N channel pull down transistor 44, and Schottky diode 46 coupled between the source and well region of P channel pull up transistor 43. Schottky diode 46 connected in this manner prevents the inherent diode formed between the drain and the well region of P channel pull up transistor 43 from forward biasing. However, this allows the well region of P channel transistor 43 to float between the supply voltage and a diode drop below the supply voltage level, which is undesirable in that floating wells are more susceptible to latch up and unpredictable performance. Also, this circuit will not prevent leakage through P channel transistor 43 when an externally applied voltage to output pad 40 exceeds its gate voltage. Other prior art variations on this circuit cause the well region of P channel pull up transistor 43 to be switched to a specific voltage level, for example by the use of field transistors. However, unless a well region is connected via a low impedance path to a fixed voltage level, latch-up is a distinct possibility. Field Effect Transistors, which are typically used for switching purposes, including possibly switching the well region of P channel pull up transistor 43, have relatively high resistance, thereby increasing the possibility of latch-up. Furthermore, this output circuit cannot be used in CMOS devices as most CMOS processes do not support the fabrication of Schottky diodes.

FIG. 5 is a schematic diagram of a prior art MOS output stage utilizing both an N channel pull up transistor 53 and an N channel pull down transistor 54. However, the use of an N channel pull up transistor 53 at lower voltages, such as with a 3.3 volt power supply level, does not provide sufficient over- drive to provide a sufficiently high output voltage level on output pad 50.

FIG. 6 is a prior art MOS output stage similar to that of FIG. 5 which overcomes the problems of FIG. 5 by utilizing a separate diffusion mask to provide a lower threshold voltage for N channel pull up transistor 63 than is provided for other N channel transistors in the device, including pull down transistor 64. This provides a greater amount of overdrive, even when using low voltages such as a 3.3 volt power supply voltage. However, this prior art device has the significant disadvantage of requiring a separate diffusion mask, thereby increasing the number of steps required to fabricate this device and adding a significant amount to fabrication cost.

FIG. 7 is a schematic diagram of a prior art bipolar output stage used in certain BiCMOS devices. When used with a low voltage device, such as a device using a 3.3 volt power supply, NPN pull up transistor 73 does not provide a sufficiently high output voltage level on output pad 70. It has been suggested that an additional PNP transistor or P channel device 75 be used as shown in order to provide an increase in output voltage on output pad 70. However, this device requires the use of bipolar transistors, and thus cannot be used in a pure MOS device, but will require the additional expense of a BiCMOS device, and will still have the problems associated with the use of a P channel pull up device.

FIG. 8 is a schematic diagram of a CMOS output stage which can be used with low voltage devices. In this prior art output stage, the gate oxide for output transistors 83 and 84 is approximately 150Å while the gate oxide for other transistors in the integrated circuit, such as exemplified by buffer 89, is approximately 110Å. This serves to improve the reliability of the output stage, in that output transistors, which may see a relatively high externally applied voltage, have thicker gate oxides which are better capable of withstanding the externally applied high voltage. However, this does not solve the problem of P channel pull up transistor 83 conducting when an externally applied voltage to output pad 80 exceeds the supply voltage of the device, for example when the device is powered by 3.3 volts and an external 5 volts is applied to output pad 80. Furthermore, output transistors 83 and 84 must be made larger since their channel lengths must be increased with increasing gate oxide thicknesses. Perhaps an even greater problem is the fact that this process is complex, and therefore expensive, in that at least two separate masks are required to achieve two separate gate oxide thicknesses in a single integrated circuit.

The disadvantage of requiring two separate gate oxide thicknesses can be overcome, of course, by using a 150Å gate oxide for the entire integrated circuit. However, this will increase the die size as devices must be made larger (with increased channel lengths) with increasing gate oxide thicknesses. Also, thicker gate oxides result in a reduction in speed. Furthermore, this circuit could be used with a 3.3 volt supply powering the internal logic of the integrated circuit and a 5 volt supply powering the output buffer. However, this will either require two separate external supplies, or will require the 3.3 volt supply to be internally generated on chip from the externally applied 5 volt supply. This consumes power, and integrated circuit die area, and leads away from the desire to provide integrated circuits which operate with lower voltage supplies.

SUMMARY

In accordance with the teachings of this invention, a novel input stage is taught which is suitable for use with any desired supply voltage VCC, including supply voltages less than 5 volts, and which is capable of withstanding an overvoltage input signal greater than VCC applied to its input pad. A pass transistor is used between the input pad and the input buffer in order to limit the voltage supplied to the input buffer, thereby allowing voltages in excess of VCC to serve as a legitimate logical one input signal to the input buffer. In one embodiment, overvoltage protection is used to limit the voltage on the input pad to a voltage in excess of the greater-than-VCC legitimate input voltage.

Also in accordance with the teachings of this invention is taught an output stage which is suitable for use with a wide variety of supply voltages, including supply voltages less than 5 volts, while allowing proper operation in the event that a legitimate overvoltage is applied to its output pad. In one embodiment ESD protection is provided in order to limit the voltage on the output pad to a voltage greater than the maximum legitimate overvoltage. Cascode devices are used in order to limit the voltages seen by the pull up and pull down transistors when a legitimate overvoltage is applied to the output pad. Suitable transistor switches are used in order to prevent excessive current from being dissipated when a legitimate overvoltage is externally applied to the output pad when the output stage of this invention is in either the high impedance mode of operation, or the active high mode of operation.

DETAILED DESCRIPTION

Figure 1:
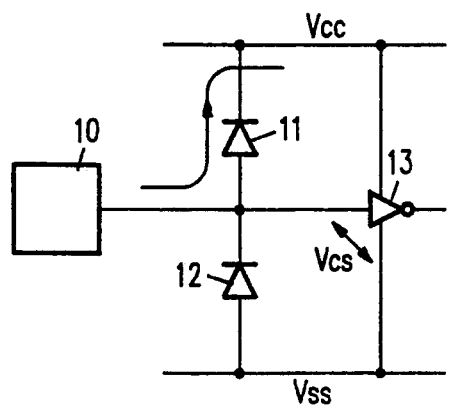
FIGS. 1-8 are prior art input and output circuits.
Figure 2:
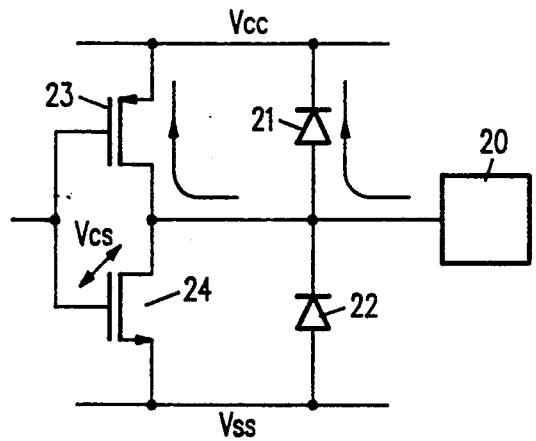
Figure 3:
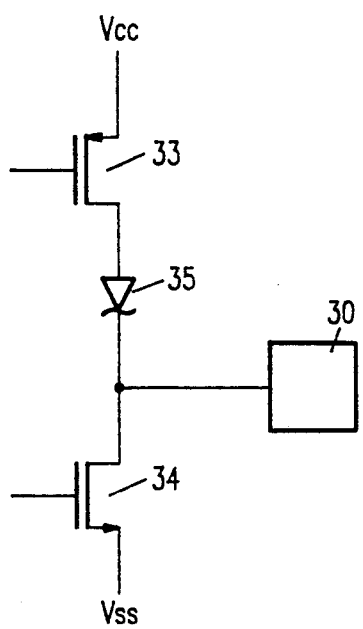
Figure 4:
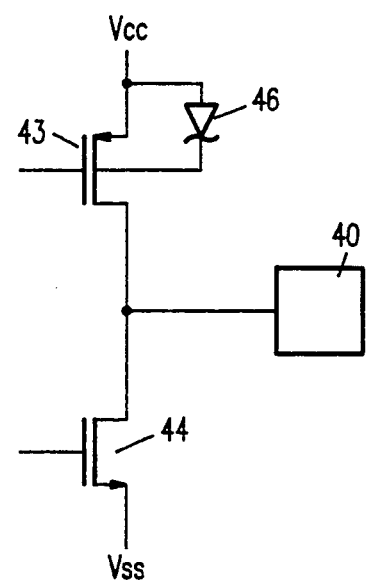
Figure 5:
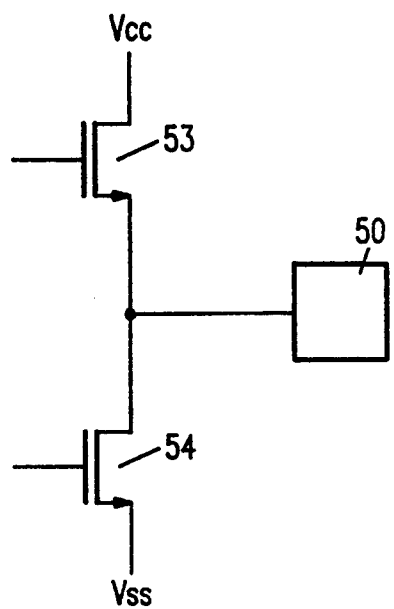
Figure 6:
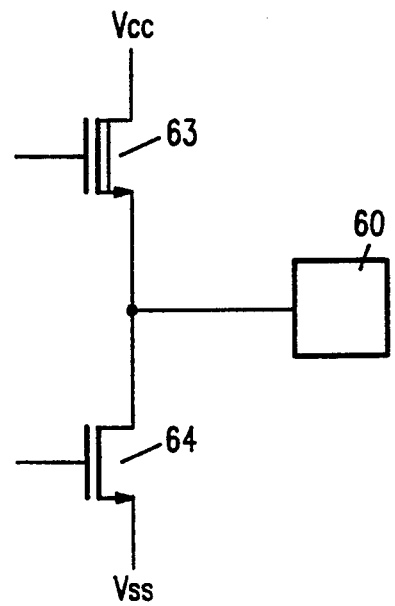
Figure 7:
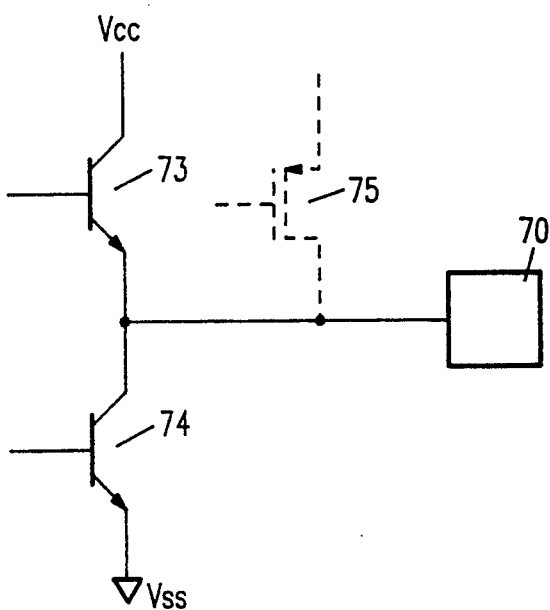
Figure 8:
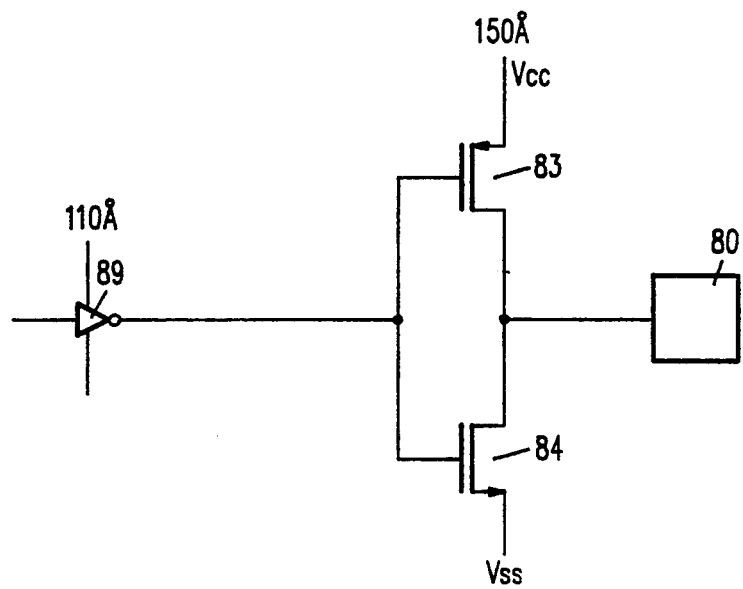
Figure 9:
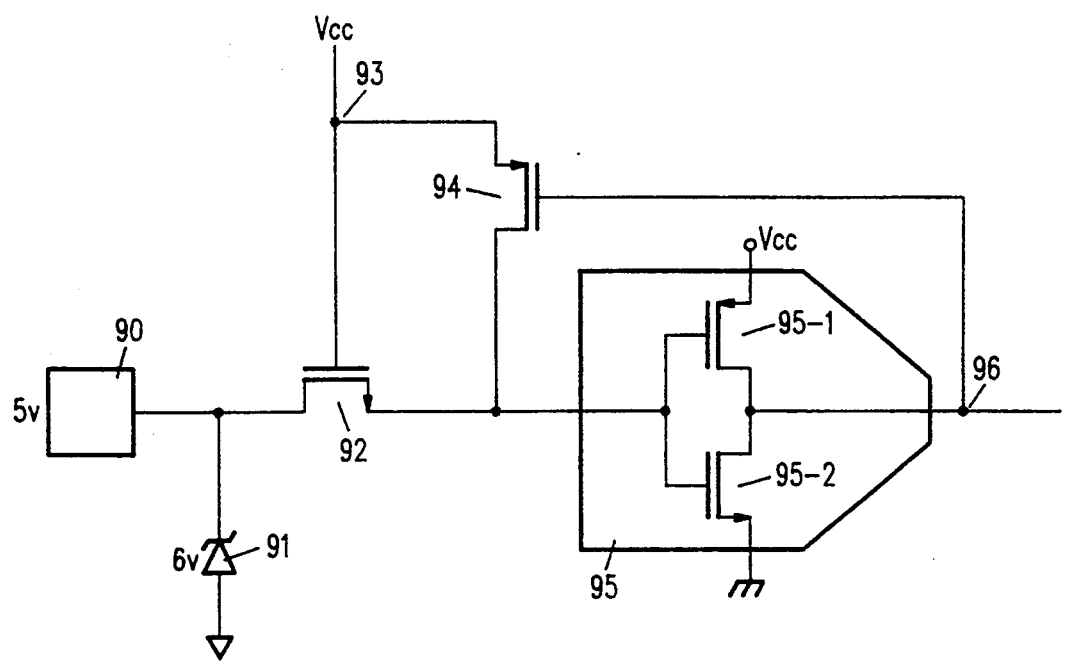
FIG. 9 is a schematic diagram of one embodiment of the input stage constructed in accordance with the teachings of this invention.

FIG. 9 is a schematic diagram of one embodiment of an input stage constructed in accordance with the teachings of this invention. This input stage is suitable for use with any desired supply voltage VCC, including supply voltages less than 5 volts, and is capable of withstanding an overvoltage input signal greater than VCC applied to its input pad 90. In one embodiment, Zener diode 91 is fabricated in a manner as taught by U.S. patent application Ser. No. 652,154, filed Feb. 7, 1991, and assigned to National Semiconductor Corporation, the assignee of this application. Zener diode 91, which in one embodiment has a 6 volt Zener voltage, serves to provide both positive and negative overvoltage protection for input pad 90 by providing a 6 volt overvoltage protection. In accordance with the teachings of this invention, ESD protection is provided while allowing an acceptable overvoltage of, for example a typical TTL logical one level of 5 volts, to be treated as an acceptable input signal.

N channel pass transistor 92 has its gate connected to supply voltage VCC node 93, its drain connected to input pad 90, and its source connected to the input lead of input buffer 95. Input buffer 95 is constructed in any convenient manner, such as those which are well known in the art. In one embodiment, input buffer 95 is a CMOS invertor, although alternative input buffer circuits can be used, such as Schmidt triggers, noninverting buffers, or the like, as will be well appreciated by those of ordinary skill in the art in light of the teachings of this invention. The devices within invertor 95 are sized to provide a desired trip point. In one embodiment, in which supply voltage VCC is 3.3 volts, the trip point of invertor 95 is set to approximately 1.4 volts so that voltages appearing on the input lead of invertor 95 which are greater than 1.4 volts will be treated as a logical one, and voltages below 1.4 volts will be treated as a logical zero.

The use of pass transistor 92 limits the voltage appearing on the input lead of input buffer 95 to VCC−VTN, where VTN is the threshold voltage of N channel transistor 92. In one embodiment, VTN is approximately 1 volt, and thus transistor 92 limits the voltage on the input lead of input buffer 95 to approximately two volts when a 3.3 volt supply voltage VCC is used, regardless of the possible overvoltage applied to input pad 90. In one embodiment of this invention in which input buffer 95 is an invertor, P channel transistor 94 is used having its gate coupled to the output lead of input buffer 95, its source coupled to supply voltage VCC, and its drain coupled to the input lead of input buffer 95. P channel transistor 94 turns on when input buffer 95 provides a low output voltage, thereby applying VCC to the input lead of input buffer 95. This prevents the input lead of input buffer 95 from inadvertently floating high. Without the inclusion of P channel transistor 94, the input lead of input buffer 95 would float, possibly above VCC−VTN and thus possibly up to +5 volts when an input voltage of 5 volts is applied to input pad 90. In this embodiment, channel transistor 94 is "weak", and thus its operation can be overcome by the input signal going low, so as not to permanently latch the input buffer to a high state.

In an alternative embodiment, for example when a Schmidt trigger is used as input buffer 95, P channel transistor 94 or a similar device is not needed.

Thus, in accordance with this invention, a novel input stage is taught, which provides a Zener diode which is conveniently fabricated in a CMOS process to achieve overvoltage protection for input voltages exceeding the highest legitimate input signal level. Pass transistor 92 serves to limit the voltage applied to the input lead of input buffer 95, thereby allowing a legitimate input voltage exceeding VCC to be acted upon by input buffer 95. Thus, the use of pass transistor 92 limits the voltage on the input lead of input buffer 95 to VCC−VTN, or approximately 2 volts for a 3.3 volt circuit, even when the input voltage applied to input pad 90 is higher, for example 5 volts. This improves the reliability by preventing excessive voltage from being applied to the gate oxide of the transistor elements of input buffer 95. The input stage has a high input impedance due to the high input impedance of the MOS devices used in input buffer 95. This input stage can be used with any desired input voltage by providing transistors having appropriate threshold voltages and sizing the devices within input buffer 95 to provide an appropriate trip point to distinguish between a logical zero and a logical one input signal. The use of pass transistor 92 having its gate coupled to the desired supply voltage allows high input signals greater than the supply voltage to be applied to input pad 90 without deleteriously affecting the operation of the circuit or causing excessive consumption of power.

Figure 10:
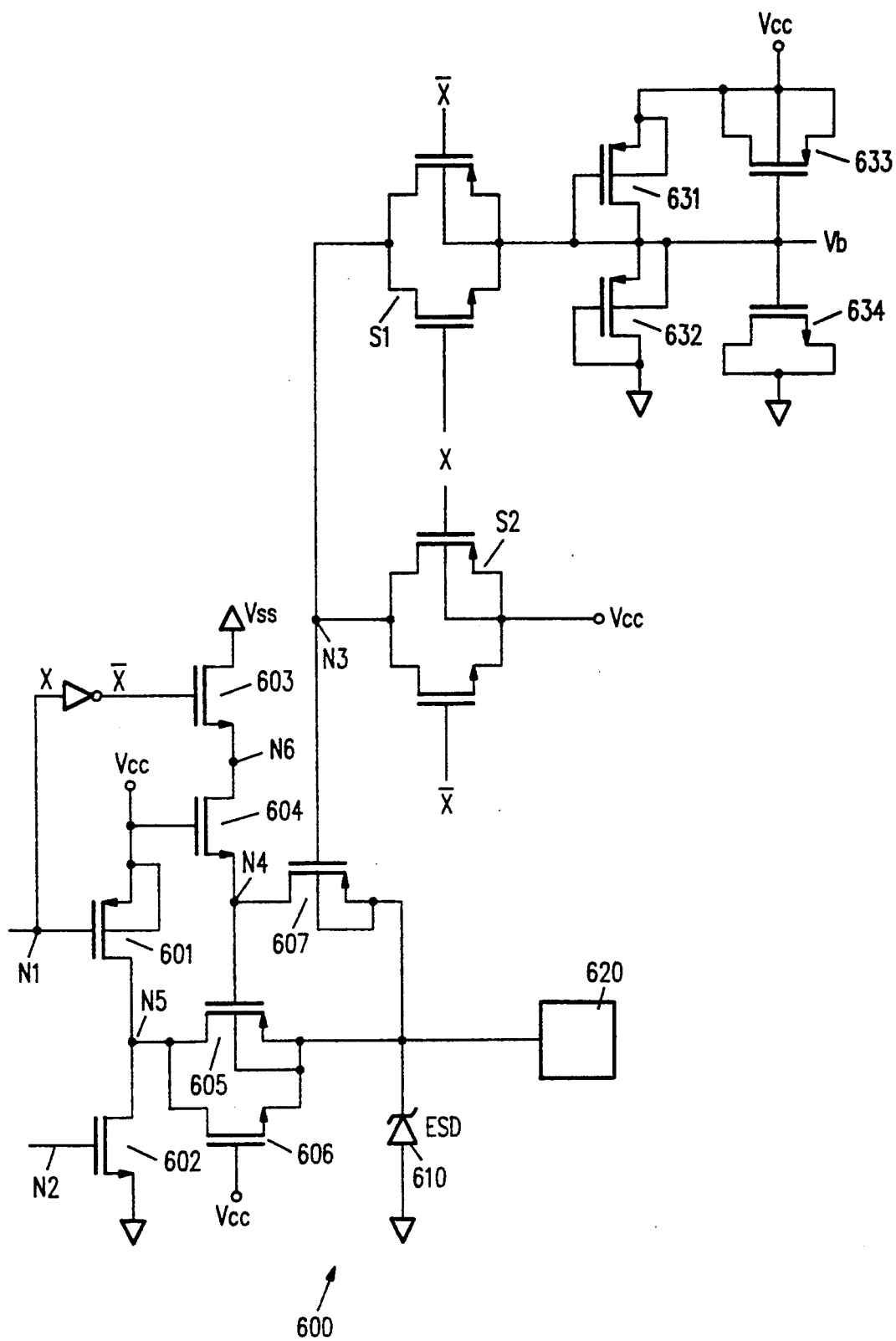
FIG. 10 is a schematic diagram of one embodiment of an input stage constructed in accordance with the teachings of this invention.

FIG. 10 is a schematic diagram of one embodiment of an MOS output stage constructed in accordance with the teachings of this invention which is suitable for use with a wide variety of supply voltages, including supply voltages less than 5 volts, while allowing proper operation in the event that a legitimate overvoltage is applied to its output pad 620. Table 1 depicts the operation of various components of output stage 600 for active high, active low, and high impedance operation, including when an external overvoltage is applied to output pad 620.

Output stage 600 includes ESD protection Zener diode 610 coupled to output pad 620 which provides both positive and negative ESD protection Zener diode 610 may be fabricated in a manner taught in the aforementioned U.S. patent application Ser. No. 652,154. In one embodiment, Zener diode 610 has a Zener voltage of approximately 6 volts, thereby providing overvoltage protection for voltages applied to output pad 620 which exceed the highest possible legitimate voltage, such as a TTL logical one level of 5 volts. Input nodes N1 and N2 receive logic levels defining whether output stage 600 should provide a high output signal, a low output signal, or a high impedance tristate level on output pad 620. P channel transistor 601 serves as the pull up transistor and N channel transistor 602 serves as the pull down transistor associated with output pad 620. Transistor 606 is a cascode connected N channel device used to limit the voltage on node N5 to VCC−VTN (about 2 volts maximum for VCC=3.3 volts) when output pad 620 is in the high impedance state. Note that if transistor 606 were not used, and a 5 volt external signal were applied to output pad 620, the drain to source voltage of N channel pull down transistor 602 would be about 5 volts, and the drain to gate voltage (when the gate is at zero volts) will be about 5 volts, which is excessive for a process limited to a 3.3 volt VCC, or less. Transistor 604 is used as a cascode device to protect the drain of transistor 603 since node N4 will receive 5 volts from output pad 620 when operated in the high impedance state and an externally applied 5 volts is provided on output pad 620. During the high impedance mode of operation, the gate of P channel transistor 607 receives 1.7 volts from node N3, and N channel transistor 603 is turned off by virtue of the voltage applied to its gate. When output pad 620 is pulled to an externally supplied 5 volts under these conditions, the gate of P channel transistor 605 is connected directly to output pad 620 by P channel transistor 607, thereby eliminating any leakage through transistor 605 to node N5. Of interest, P channel transistors 605 and 607 have their wells connected to output pad 620 in order to prevent forward biasing of their P+/N− junctions during the high impedance mode of operation, even with an externally applied 5 volts applied to output pad 620. N channel transistor 604 keeps node N6 at most 2 volts (VCC−VTN), when transistor 603 is off and transistor 607 is on, even when an excessive voltage is externally applied to output pad 620. Thus, when output pad 620 receives anywhere between 3.3 and 5 volts, P channel transistor 607 is on and the gate of P channel transistor 605 is thus connected to output pad 620, preventing any leakage to node N5 through transistor 605.

The gate of P channel transistor 605 is pulled to VSS (ground) when transistors 603 and 604 are on, turning on transistor 605. When operated in the active high state, the gate of P channel transistor 607 receives VCC from node N3, causing transistor 607 to be turned off and thus isolating the gate of P channel transistor 605 from output pad 620.

Figure 12A:
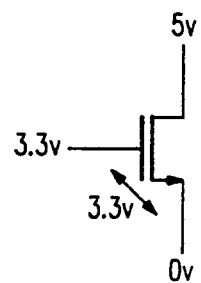
FIGS. 12a and 12b are a depiction of the voltages impressed across the gate oxides of N channel and P channel transistors.
Figure 12B:
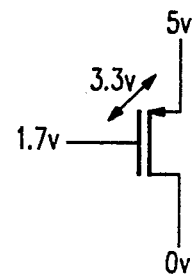

Switches S1 and S2 provide either VCC or a bias voltage Vb to node N3 and thus to the gate of P channel transistor 607. In one embodiment of the example in which VCC is 3.3 volts, VB is selected to be approximately 1.7 volts so that the stress is the same across the gate oxides of both N channel and P channel transistors which are subjected to an externally applied 5 volt level, as depicted in FIGS. 12a and 12b. This may be generalized by providing that VB is selected to be the equal to the highest legitimate externally applied voltage level minus the VCC of the circuit. Several examples are depicted in Table 3.

The selection of the voltage applied to node N3 which is coupled to the gate of transistor 607 is made by the logical value received on node N1. Thus, when output stage 600 is to operate to provide an active high output level on output pad 620, voltage VCC is selected for application to the gate of transistor 607, causing transistor 607 to turn on and allowing output pad 620 to be pulled up through transistor 607, cascode device 604, and pull up transistor 603. Conversely, when output pad 620 is not to be pulled up, either because it is to be pulled low by pull down transistor 602, or is to be in the high impedance state, voltage Vb is selected for application to the gate of transistor 607, turning off transistor 607.

In the embodiment in which VCC is about 3.3 volts and thus VB is about 1.7 volts, during in the high impedance mode, 1.7 volts is selected so that in the event 5 volts is applied to output pad 620 at most 3.3 volts will appear across the gate oxide of P channel transistor 607. Transistor 631, 632, 633, and 634 provide a DC bias generator generating from VCC bias voltage Vb (e.g. 1.7 volts) which can be selected by switch S1. Since this bias generator only feeds the gate of P channel transistor 607, there is no need for availability of DC current to be supplied by the Vb bias generator, and thus the bias current can be made very small, for example 1 microamp or less, for an entire integrated circuit. Transistors 631 and 632 operate as a voltage divider, and transistors 633 and 634 are coupled to serve as storage capacitors, allowing the small bias current to provide adequate transient current to the gate of P channel transistor 607 when switch S1 is operated to provide Vb to N3. In addition to preventing leakage current in the high impedance state when an externally applied voltage greater than VCC is applied to output pad 620, there is another leakage requirement which may be desirable. In the event that output circuit 600 is in the active high state, and an externally applied voltage greater than VCC is applied to output pad 620, output buffer 600 will try to sink current from output pad 620. This current is wasted, since output buffer 620 is already in the active high state. In accordance with one embodiment of this invention, a circuit is provided which detects the condition in which the output pad 620 is at a voltage exceeding VCC, and output buffer 600 is in the active high state. In this event, detection circuit cuts off all output current to output buffer 600.

Figure 11:
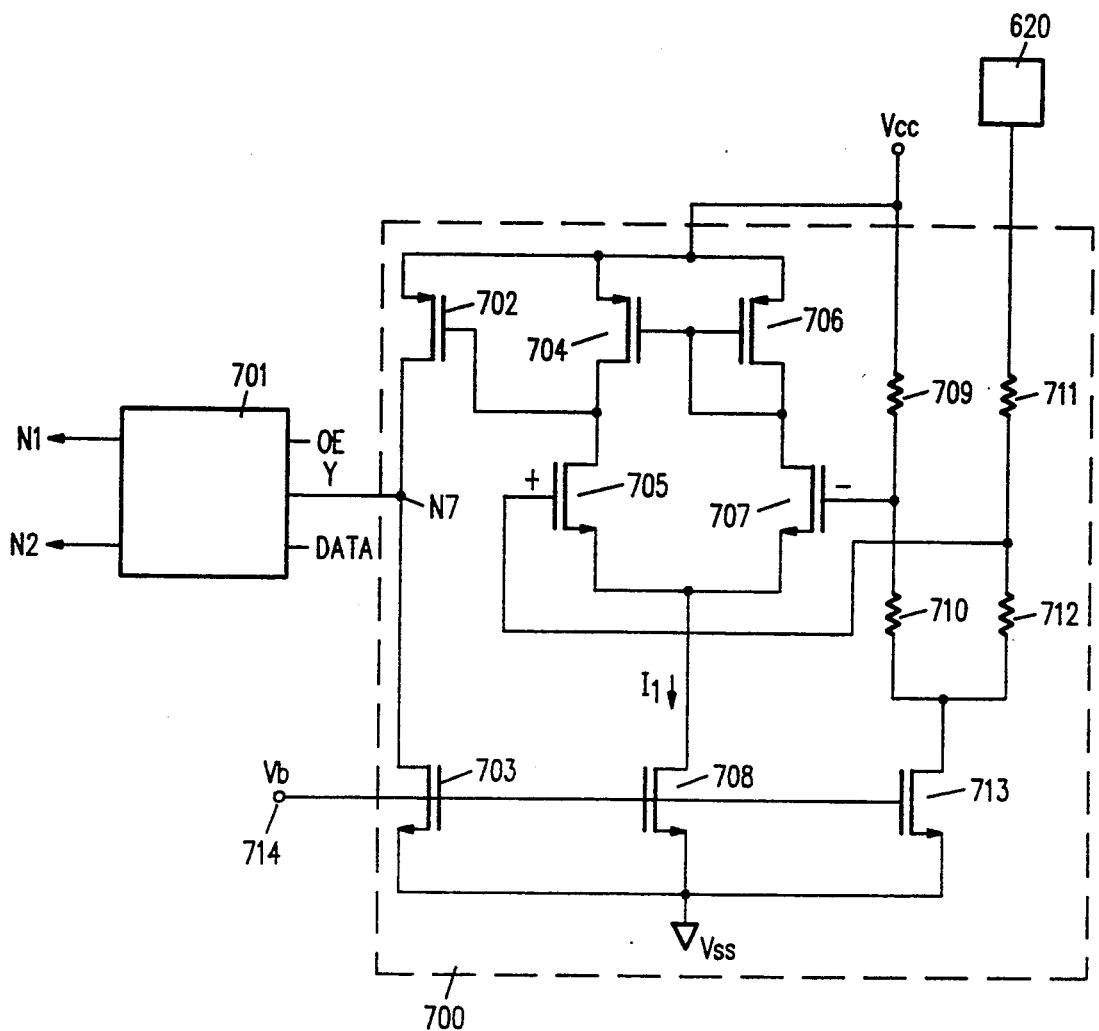
FIG. 11 is a schematic diagram of one embodiment of an output stage constructed in accordance with the teachings of this invention.

FIG. 11 is a schematic diagram of one embodiment of such a detection circuit 700. The voltage on output pad 620 is compared to VCC by comparator 700, which provides its output signal at node N7 indicating whether the voltage on output pad 620 is greater than VCC. Voltage comparator 700 includes current sources 703, 708, and 713 receiving a bias voltage (for example VB) on their commonly connected gates 714. If desired, commonly connected gates 714 can receive an enable/disable signal, with the enable voltage level being VB, and the disable voltage level being 0 volts, for example. When disabled, current flow through transistors 703, 708, and 713 is reduced to zero, thereby limiting power consumption of the integrated circuit, when it is determined that the function of comparator 700 need not be used in a particular application. When enabled, the DC current through transistors 703, 708, and 713 can be made small to minimize power consumption of the integrated circuit, since generally switching speed of comparator 700 is not important.

A voltage divider consisting of resistors 709 and 710 (or MOS devices connected as load devices) provides a voltage related to VCC on the gate of inverting input transistor 707. Similarly, a voltage divider formed by resistors 711 and 712 (or MOS devices connected as load devices) provides a voltage related to the voltage on output pad 620 to the gate of noninverting input transistor 705, and prevent possible damage to transistors 705 and 707. Transistor 704, 705, 706, and 707 form a typical differential input stage established by bias current I1 through transistor 708. Bias current I1 can be made very small, for example on the order of one microamp, thereby requiring an insignificant amount of power. The drain of transistor 705 is coupled to the gate of P channel transistor 702, which provides a buffered and amplified output signal from the differential input stage to node N7. Output node N7 is coupled to logic circuit 701, which also receives the output enable (OE) and data signals from the circuit driving output buffer 600 (FIG. 10). Logic circuit 701 produces output controlling signals for application to nodes N1 and N2 of output buffer 600 thus controlling the operation of output buffer 600 by controlling the operation of P channel pull up transistor 601 and N channel pull down transistor 602.

The operation of logic circuit 701 is depicted in Table 2. With output enable signal OE low, indicating that output pad 620 is to be a high impedance signal, pull-up drive applied to node N1 and pull-down applied to node N2 are both turned off, regardless of the state of the data signal, or whether an external voltage greater than VCC is applied to output terminal 620, thereby insuring that output circuit 600 of 10 provides a high impedance output signal. Conversely, with a logical one output enable signal, pull-up drive and pull-down drive is applied as required in order to cause output stage 600 to provide the desired active high or active low output signal. This is the case when the voltage on output terminal 620 is not greater than VCC. However, when output voltage comparator 700 determines that the voltage on output terminal 620 is greater than VCC, pull-up drive applied to node N1 is disabled when the data is a logical one, thereby preventing an undesired current between output terminal 620 and VCC through transistors 603, 604, and 607 of output circuit 600. This prevents excessive current from being consumed by output circuit 600 in the event it attempts to apply a high output voltage on output terminal 620 which is exceeded by an externally applied voltage on output terminal 620.

TABLE 1

| N1 | N2 | N3 | 601 | 602 | N5 | 603 | 604 | N4 | 605 | 606 | 607 | Output |
|---|---|---|---|---|---|---|---|---|---|---|---|---|
| low | low | high | on | off | high | on | on | low | on | off | on | active high |
| high | high | low | off | on | low | off | don't care | float | off | on | don't care | active low |
| high | low | low | off | off | VCC-VTN | off | cascode | coupled to output 620 | off | cascode | on | high Z; external overvoltage |
| high | low | low | off | off | VCC-VTN | off | don't care | float | don't care | cascode | don't care | high Z |

TABLE 2

| OE | V OUT > VCC | Data | Pull-up Drive (N1) | Pull-down Drive (N2) |
|---|---|---|---|---|
| 0 | yes | 0 | off (high) | off (low) |
| 0 | yes | 1 | off (high) | off (low) |
| 0 | no | 0 | off (high) | off (low) |
| 0 | no | 1 | off (high) | off (low) |
| 1 | no | 0 | off (high) | on (high) |
| 1 | no | 1 | on (low) | off (low) |
| 1 | yes | 0 | off (high) | on (high) |
| 1 | yes | 1 | off (high)* | off (low) |

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An input/output stage for interfacing between an internal and an external circuit comprising;
   an I/O terminal for connecting to said external circuit;
   an internal terminal for connecting to said internal circuit;
   a first supply voltage terminal for receiving a first supply voltage;
   a second supply voltage terminal for receiving a second supply voltage;
   an I/O buffer powered by said first and second supply voltages, having a first lead serving as said internal terminal of said input stage and having a second lead connected to said internal circuit;
   a voltage limiting circuit connected between said I/O terminal of said input stage and said first lead of said I/O buffer, said voltage limiting circuit providing that a voltage applied to said first lead of said I/O buffer does not exceed the voltage level of said first supply voltage when a voltage is applied to said I/O terminal which may exceed the voltage level of said first supply voltage; and
   a circuit which prevents said first lead of said I/O buffer from floating.

2. An input/output stage as in claim 1 wherein said voltage limiting circuit provides a logical zero signal to said first lead of said I/O buffer in response to a logical zero input signal applied to said I/O terminal, and provides a logical one signal which does not exceed the voltage level of said first supply voltage in response to a logical one input signal applied to said I/O terminal which may exceed the voltage level of said first supply voltage.

3. An input/output stage as in claim 1 wherein said voltage limiting circuit comprises a transistor having a first current handling terminal connected to said I/O terminal of said input/output stage, a second current handling terminal connected to said first lead of said I/O buffer, and a control terminal connected to said first supply voltage.

4. An input/output stage as in claim 3 wherein said transistor comprises an MOS transistor.

5. An input/output stage as in claim 1 which further comprises an overvoltage protection circuit for providing protection against excessive voltages applied to said I/O terminal of said I/O stage.

6. An input/output stage as in claim 5 wherein said overvoltage protection circuit provides protection against an excessive voltage which exceeds the maximum voltage level of a legitimate logical one signal.

7. An input/output stage as in claim 6 wherein said overvoltage protection circuit comprises a device for shunting said excessive voltage to one of said supply voltages.

8. An input/output stage as in claim 7 wherein said overvoltage protection circuit comprises a zener diode connected between said I/O terminal of said input/output stage and said second one of said supply voltages.

9. An input/output stage as in claim 1 wherein said I/O buffer comprises a buffer selected from the group of buffers consisting of inverters, CMOS inverters, non-inverting buffers, and Schmidt triggers.

10. An input/output stage as in claim 1 wherein said circuit which prevents said first lead of said I/O buffer from floating comprises a transistor having a first current handling terminal connected to one of said supply voltages, a second current handling terminal connected to said first lead of said I/O buffer, and a control terminal connected to said second lead of said I/O buffer.

11. An input/output stage as in claim 10 wherein said transistor comprises an MOS transistor having said first current handling terminal connected to said first supply voltage.

12. An input/output stage as in claim 11 wherein said transistor is a weak transistor whose effect on said first lead of said input buffer is overcome by the effect of said voltage received from said external circuit on said first lead of said I/O buffer.

13. An input stage comprising;
an input terminal for receiving an input signal;
an output terminal for providing a buffered input signal in response to said input signal;
a first supply voltage terminal for receiving a first supply voltage;
a second supply voltage terminal for receiving a second supply voltage;
an input buffer powered by said first and second supply voltages, and having an input lead, and an output lead serving as said output terminal of said input stage;
a voltage limiting circuit coupled between said input terminal of said input stage and said input lead of said input buffer, said voltage limiting circuit providing, in response to said input signal, a voltage to said input lead of said input buffer which does not exceed the voltage level of said first supply voltage; and
a circuit which prevents said input lead of said input buffer from floating.

14. An input stage as in claim 13 wherein said voltage limiting circuit provides a logical zero signal to said input lead of said input buffer in response to a logical zero input signal, and provides a logical one signal which does not exceed the voltage level of said first supply voltage in response to a logical one input signal which may exceed the voltage level of said first supply voltage.

15. An input stage as in claim 13 wherein said voltage limiting circuit comprises a transistor having a first current handling terminal connected to said input terminal of said input stage, a second current handling terminal connected to said input lead of said input buffer, and a control terminal connected to said first supply voltage.

16. An input stage as in claim 15 wherein said transistor comprises an MOS transistor.

17. An input stage as in claim 13 which further comprises an overvoltage protection circuit for providing protection against excessive voltages applied to said input terminal of said input stage.

18. An input stage as in claim 17 wherein said overvoltage protection circuit provides protection against an excessive voltage which exceeds the maximum voltage level of a legitimate logical one input signal.

19. An input stage as in claim 18 wherein said overvoltage protection circuit comprises a device for shunting said excessive voltage to one of said supply voltages.

20. An input stage as in claim 19 wherein said overvoltage protection circuit comprises a zener diode connected between said input terminal of said input stage and said second one of said supply voltages.

21. An input stage as in claim 13 wherein said input buffer comprises a buffer selected from the group of buffers consisting of inverters, CMOS inverters, noninverting buffers, and Schmidt triggers.

22. An input stage as in claim 13 wherein said circuit which prevents said input lead of said input buffer from floating comprises a transistor having a first current handling terminal connected to one of said supply voltages, a second current handling terminal connected to said input lead of said input buffer, and a control terminal connected to said output lead.

23. An input stage as in claim 22 wherein said transistor comprises an MOS transistor having said first current handling terminal connected to said first supply voltage.

24. An input stage as in claim 23 wherein said transistor is a weak transistor whose effect on said input lead of said input buffer is overcome by the effect of said input voltage on said input lead of said input buffer.

25. An output stage comprising;
an output terminal for providing an output signal;
one or more control terminals for receiving control signals for controlling said output signal provided by said output stage on said output terminal;
a first supply voltage terminal for receiving a first supply voltage;
a second supply voltage terminal for receiving a second supply voltage;
a pull up device for applying said first supply voltage to said output terminal via a first node in response to said control signals;
a pull down device for applying said second supply voltage to said output terminal via said first node in response to said control signals;
a pass transistor having a first current handling terminal connected to said first node, a second current handling terminal connected to said output terminal, and having a control terminal;
a first voltage limiting circuit connected between said first node and said output terminal; and
a control circuit for providing a signal to said control terminal of said pass transistor in response to said control signals.

26. An output stage as in claim 25 wherein said control circuit comprises;
a first transistor responsive to said one or more of said control signals for switching one of said supply voltages to a second node; and
a cascode device having a first current handling terminal connected to said second node, a second current handling terminal connected to said control terminal of said pass transistor, and a control terminal connected to one of said supply voltages.

27. An output stage as in claim 25 wherein said first voltage limiting circuit comprises a cascode circuit comprising a transistor having a first current handling terminal connected to said first node, a second current handling terminal connected to said output terminal, and a control terminal connected to one of said supply voltages.

28. An output stage as in claim 25 which further comprises a device having a first current handling terminal connected to said control terminal of said pass transistor, a second current handling terminal connected to said output terminal, and a control terminal for receiving a first selected voltage level when said output stage is operating in response to said control voltages to provide a logical one output signal, and a second selected voltage level when said output stage is operating in response to said control voltages to provide a logical zero output signal.

29. An output stage as in claim 28 wherein said control terminal of said device also receives said second selected voltage level when said output stage is operating in response to said control voltages to provide a high impedance on said output signal.

30. An output stage as in claim 28 which further comprises an overvoltage protection circuit for providing protection against excessive voltages applied to said output terminal of said input stage.

31. An output stage as in claim 30 wherein said overvoltage protection circuit provides protection against an excessive voltage which exceeds the maximum voltage level of a legitimate logical one output signal.

32. An output stage as in claim 31 wherein said overvoltage protection circuit comprises a device for shunting said excessive voltage to one of said supply voltages.

33. An output stage as in claim 32 wherein said overvoltage protection circuit comprises a zener diode connected between said output terminal of said output stage and said second one of said supply voltages.

34. An output stage as in claim 25 which further comprises;
- a voltage comparison circuit for determining when the voltage on said output terminal exceeds said first supply voltage and providing a voltage comparison signal; and
- a control circuit having input terminals for receiving output enable and data signals from a circuit which drives said output stage, and for receiving said voltage comparison signal from said voltage comparison circuit, and which has output terminals for providing said control signals to said output stage in order to provide a high impedance output signal on said output terminal of said output stage when said voltage comparison signal is in said first state and said output enable and data signals indicate said output stage should provide a logical one output signal on said output terminal of said output stage.

35. An output stage comprising;
- an output terminal for providing an output signal;
- one or more control terminals for receiving control signals for controlling said output signal provided by said output stage on said output terminal;
- a first supply voltage terminal for receiving a first supply voltage;
- a voltage comparison circuit for determining when the voltage on said output terminal exceeds said first supply voltage and providing a voltage comparison signal; and
- a control circuit having input terminals for receiving output enable and data signals from a circuit which drives said output stage, and for receiving said voltage comparison signal from said voltage comparison circuit, and which has output terminals for providing said control signals to said output stage in order to provide a high impedance output signal on said output terminal of said output stage when said voltage comparison signal is in said first state and said output enable and data signals indicate said output stage should provide a logical one output signal on said output terminal of said output stage.

36. An output stage as in claim 35 wherein said voltage comparison circuit includes an enable terminal for disabling said comparison circuit.

37. A method for operating an I/O stage which includes an I/O buffer, and an I/O terminal, comprising the steps of;
- receiving on said I/O terminal an externally applied voltage;
- determining if said externally applied voltage is a legitimate signal voltage in excess of the power supply voltage applied to said I/O stage; and
- in response to said step of determining, limiting the signal voltage applied to said I/O buffer in response to said externally applied voltage to a voltage not more than said power supply voltage by;
- further determining if said I/O buffer is to provide a logical one signal on said I/O terminal corresponding to said power supply voltage; and
- in response to said step of further determining, providing a high impedance signal from said I/O buffer on said I/O terminal when said externally applied voltage is a legitimate signal voltage in excess of the power supply voltage applied to said I/O stage.

38. An input stage comprising;
- an input terminal for receiving an input signal;
- an output terminal for providing a buffered input signal in response to said input signal;
- a first supply voltage terminal for receiving a first supply voltage;
- a second supply voltage terminal for receiving a second supply voltage;
- an input buffer powered by said first and second supply voltages, and having an input lead, and an output lead serving as said output terminal of said input stage;
- a circuit which prevents said input lead of said input buffer from floating; and
- a voltage limiting circuit coupled between said input terminal of said input stage and said input lead of said input buffer, said voltage limiting circuit serving to determine if said input signal is a legitimate signal voltage in excess of said first supply voltage level and, if so, providing to said input lead of said input buffer a voltage level corresponding to the logical state of said input signal, but which does not exceed the voltage level of said first supply voltage.

39. An input stage as in claim 38 wherein said voltage limiting circuit provides a logical zero signal to said input lead of said input buffer in response to a logical zero input signal, and provides a logical one signal which does not exceed the voltage level of said first supply voltage in response to a logical one input signal which may exceed the voltage level of said first supply voltage.

40. An input stage as in claim 38 wherein said voltage limiting circuit comprises a transistor having a first current handling terminal connected to said input terminal of said input stage, a second current handling terminal connected to said input lead of said input buffer, and a control terminal connected to said first supply voltage.

41. An input stage as in claim 40 wherein said transistor comprises an MOS transistor.

42. An input stage as in claim 38 which further comprises an overvoltage protection circuit for providing protection against excessive voltages applied to said input terminal of said input stage.

43. An input stage as in claim 42 wherein said overvoltage protection circuit provides protection against an excessive voltage which exceeds the maximum voltage level of a legitimate logical one input signal.

44. An input stage as in claim 43 wherein said overvoltage protection circuit comprises a device for shunting said excessive voltage to one of said supply voltages.

45. An input stage as in claim 44 wherein said overvoltage protection circuit comprises a zener diode connected between said input terminal of said input stage and said second one of said supply voltages.

46. An input stage as in claim 38 wherein said input buffer comprises a buffer selected from the group of buffers consisting of inverters, CMOS inverters, noninverting buffers, and Schmidt triggers.

47. An input stage as in claim 38 wherein said circuit which prevents said input lead of said input buffer from floating comprises a transistor having a first current handling terminal connected to one of said supply voltages, a second current handling terminal connected to said input lead of said input buffer, and a control terminal connected to said output lead.

48. An input stage as in claim 47 wherein said transistor comprises and MOS transistor having said first current handling terminal connected to said first supply voltage.

49. An input stage as in claim 48 wherein said transistor is a weak transistor whose effect on said input lead of said input buffer is overcome by the effect of said input voltage on said input lead of said input buffer.

* * * * *